US012648408B2

(12) United States Patent
    Rivera

(10) Patent No.: US 12,648,408 B2
(45) Date of Patent: Jun. 2, 2026

(54) WAFER LIFT PIN GUIDE

(71) Applicant: Applied Materials, Inc., Santa Clara, CA (US)

(72) Inventor: Hugo Rivera, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 434 days.

(21) Appl. No.: 18/479,938

(22) Filed: Oct. 3, 2023

(65) Prior Publication Data

US 2025/0112082 A1     Apr. 3, 2025

(51) Int. Cl.
    H10P 72/76          (2026.01)

(52) U.S. Cl.
    CPC ................................. H10P 72/7612 (2026.01)

(58) Field of Classification Search
    CPC ...... H10P 72/7612; H10P 72/74; C23C 14/50;
               C23C 16/4586; H01J 37/32715; H01J
                                   2237/2007; Y10S 414/135
    See application file for complete search history.

(56) References Cited

U.S. PATENT DOCUMENTS

| | | | |
|---|---|---|---|
| 5,848,670 A | 12/1998 | Salzman | |
| 10,195,704 B2 | 2/2019 | Himmelsbach et al. | |
| 10,262,887 B2 * | 4/2019 | Hao | ................... H01L 21/68742 |
| 10,857,655 B2 | 12/2020 | Cuvalci et al. | |
| 11,004,722 B2 | 5/2021 | Sarode Vishwanath et al. | |
| 2020/0157678 A1 | 5/2020 | Schaller et al. | |

FOREIGN PATENT DOCUMENTS

WO          2011009007 A2     1/2011

OTHER PUBLICATIONS

VXB.com Ball Bearings, 20mm Round Flanged Bushing Linear Motion LBF20UU, "https://vxb.com/products/20mm-round-flanged-bushing-linear-motion-lbf20uu".
India Mart, Guide Bush for CNC, "https://www.indiamart.com/proddetail/guide-bush-20998338873.html".

* cited by examiner

*Primary Examiner* — Jason L Vaughan
*Assistant Examiner* — Amanda Kreiling
(74) *Attorney, Agent, or Firm* — Patterson + Sheridan, LLP

(57)                ABSTRACT

Embodiments of the present disclosure generally relate to a lift pin guide. The lift pin guide includes a cylindrical main section, a flange, a cylindrical recess, a cylindrical extension, and a bore. The flange is disposed at a first end of the cylindrical main section and has a diameter greater than a diameter of the cylindrical main section. The cylindrical recess is formed in a first surface of the flange, the first surface of the flange being opposite the cylindrical main section, and the cylindrical recess having an outer diameter less than the diameter of the cylindrical main section. The cylindrical extension protrudes beyond the first surface of the flange, the cylindrical extension being concentric with the cylindrical main section. The bore is formed through the cylindrical main section and the cylindrical extension.

20 Claims, 3 Drawing Sheets

WAFER LIFT PIN GUIDE

BACKGROUND

Field

Embodiments of the present disclosure generally relate to apparatus for processing a substrate. More specifically, embodiments described herein provide for a wafer lift pin guide.

Description of the Related Art

Semiconductor wafer processing systems typically contain a reaction chamber within which a wafer is supported by a pedestal in communication with a lift pin assembly. In some reaction chambers the pedestal may be an electrostatic chuck (ESC). The lift pin assembly may include one or more lift pins. The lift pin(s) generally must withstand the high temperatures of the reaction chamber (e.g., approximately 400 degrees Celsius).

Lift pins that are formed of hard materials have been known to scratch the back of the wafer when the wafer is positioned on the ESC. Softer lift pin materials have been considered. However, due to rubbing between the lift pin and the ESC, the lift pin may encounter wear, whereby particles from the lift pin are released. These particles deposit on the surface of the ESC on which the wafer is positioned and may cause indentation and contamination on the backside of the wafer. This issue is particularly prevalent in lift pins that are formed of softer materials.

SUMMARY

Embodiments of the present disclosure generally relate to a lift pin guide. The lift pin guide includes a cylindrical main section, a flange, a cylindrical recess, a cylindrical extension, and a bore. The flange is disposed at a first end of the cylindrical main section and has a diameter greater than a diameter of the cylindrical main section. The cylindrical recess is formed in a first surface of the flange, the first surface of the flange being opposite the cylindrical main section, and the cylindrical recess having an outer diameter less than the diameter of the cylindrical main section. The cylindrical extension protrudes beyond the first surface of the flange, the cylindrical extension being concentric with the cylindrical main section. The bore is formed through the cylindrical main section and the cylindrical extension.

In another embodiment, a lift pin guide assembly includes a spring and a lift pin guide. The lift pin guide includes a cylindrical main section, a flange, a cylindrical recess, a cylindrical extension, and a bore. The flange is disposed at a first end of the cylindrical main section and has a diameter greater than a diameter of the cylindrical main section. The cylindrical recess is formed in a first surface of the flange, the first surface of the flange being opposite the cylindrical main section, and the cylindrical recess having an outer diameter less than the diameter of the cylindrical main section. The cylindrical extension protrudes beyond the first surface of the flange the cylindrical extension concentric with the cylindrical main section. The bore is formed through the cylindrical main section and the cylindrical extension.

In another embodiment, a lift pin guide assembly includes a lift pin, a spring, and a lift pin guide. The lift pin guide includes a ceramic body, a cylindrical main section, a flange, a cylindrical extension, and a bore. The flange is disposed at a first end of the cylindrical main section and has having a diameter greater than a diameter of the cylindrical main section. The cylindrical extension protrudes beyond a first surface of the flange, the first surface of the flange being opposite the cylindrical main section, and the cylindrical extension being concentric with the cylindrical main section. The bore is formed through the cylindrical main section and the cylindrical extension.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus for processing a substrate. More specifically, embodiments described herein provide for a wafer lift pin guide.

The lift pin guide described herein allows for a change in the point of contact for the lift pin so that the lift pin is not rubbing against the ESC. In turn, the lift pin does not release particles which can indent and contaminate the backside of a substrate wafer.

Figure 1:
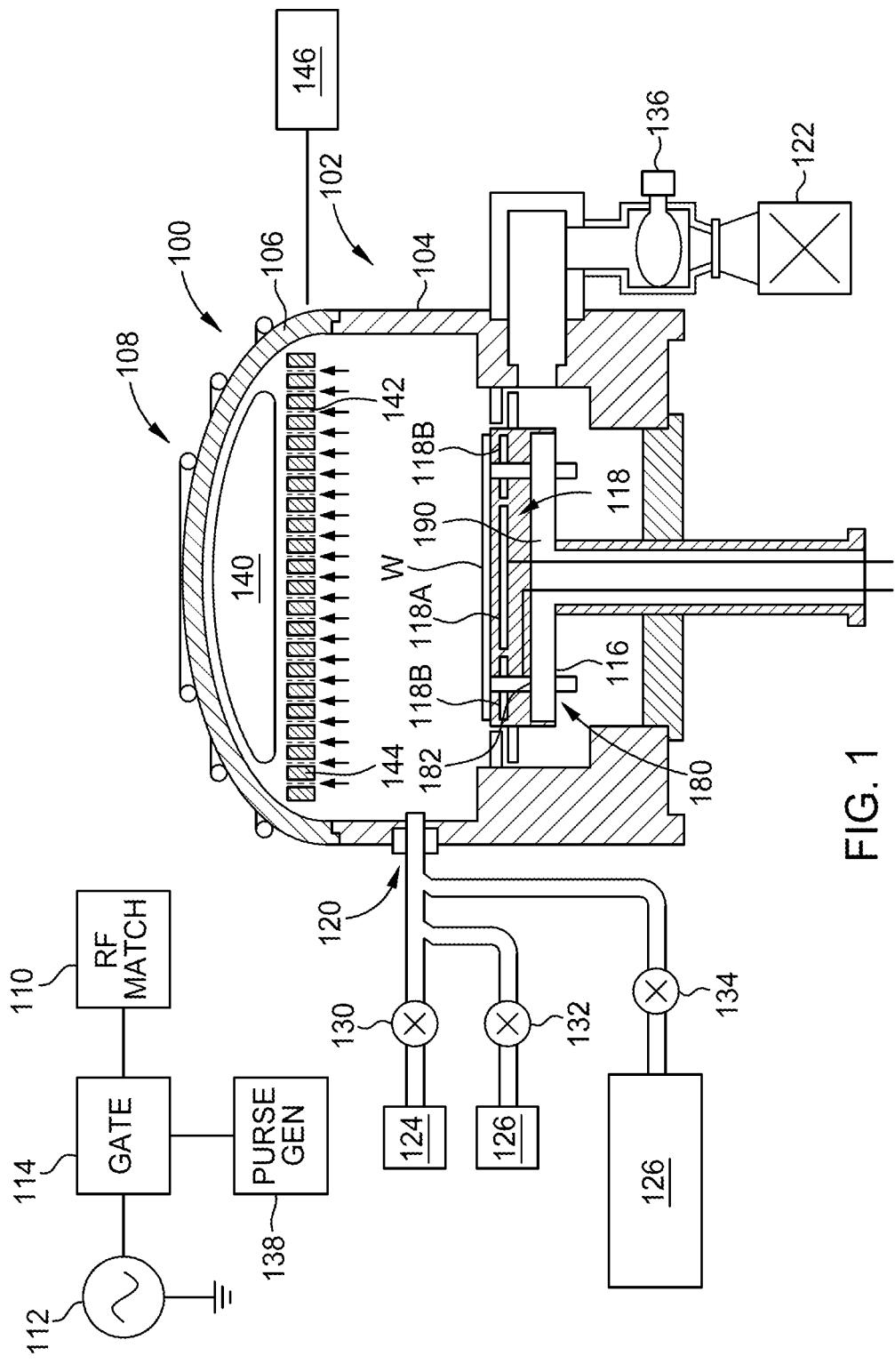
FIG. 1 is a schematic cross-sectional view of a processing chamber, according to one or more embodiments.

FIG. 1 schematically illustrates a substrate processing system 100 that may be used to perform aspects of the methods described herein. The substrate processing system 100 may be any type of processing chamber suitable for processing a substrate. In one or more embodiments, the substrate processing system 100 may be a Decoupled Plasma Oxidation (DPO) reactor or a Decoupled Plasma Nitridation (DPN) reactor available from Applied Materials, Inc., of Santa Clara, Calif.

The substrate processing system 100 includes a chamber 102 having a cylindrical side wall 104 and a ceiling 106 which may be either dome-shaped (as shown in FIG. 1), flat, or other geometry. The substrate processing system 100 may provide a low ion energy plasma via an inductively coupled plasma (ICP) source power applicator driven by a pulsed or continuous wave (CW) RF power generator. The ICP source power applicator comprises a coil antenna 108 disposed over the ceiling 106 and coupled through an impedance match network 110 to an RF power source including an RF power generator 112 and a gate 114 at the output of the RF power generator 112 controlled by a pulse signal having a selected duty cycle. It is contemplated that other low ion energy producing plasma source power applicators may be utilized as well, such as remote RF or microwave plasma sources. Alternatively, the power generator can be a pulsed DC generator. The substrate processing system 100 may include a transformer coupled plasma (TCP) source or a microwave plasma source.

The substrate processing system 100 further includes a substrate support pedestal 116, such as an electrostatic chuck (ESC) or other suitable substrate support, for holding a substrate W. A "substrate" or "substrate surface," as described herein, generally refers to any substrate surface upon which processing is performed. Although the embodiments disclosed herein are generally described with reference to a round 200 mm or 300 mm substrate, other shapes, such as polygonal, squared, rectangular, curved, or otherwise non-circular substrates may be utilized according to the embodiments described herein. The substrate support pedestal 116 typically includes a heating apparatus, such as a heater 118 beneath the top surface of the substrate support pedestal 116. The heater 118 may be a single or multiple zone heater, such as a dual radial zone heater having radially inner and outer heating elements 118A, 118B, as depicted in FIG. 1. In some embodiments, which can be combined with other embodiments described herein, a cooling base 190 is disposed beneath the substrate support pedestal 116.

The substrate processing system 100 further includes a lift pin assembly 180 configured to actuate a lift pin 182 in a vertical direction. The lift pin 182 may contact the substrate W in order to lift and/or lower the substrate W with respect to the substrate support pedestal 116.

The substrate processing system 100 may further include a gas injection system 120 and a vacuum pump 122 coupled to the interior of the chamber 102. The gas injection system 120 is supplied to one or more process gas sources, for example, an oxidizing gas container 124 for supplying oxidizing gases including $O_2$, $N_2O$, NO, $NO_2$, $H_2O$, $H_2$, and $H_2O_2$, a reducing gas container 126 for supplying reducing gases such as hydrogen, or other process gas source as required for a particular application, for example, gases such as He, Ar, or nitridizing gases such as $N_2$. Flow control valves 130, 132, and 134 respectively coupled to the gas sources (e.g., the oxidizing gas container 124, the reducing gas container 126, etching gas containers 128, and the like) may be utilized to selectively provide process gases or process gas mixtures to the interior of the chamber 102 during processing. Other gas sources (not shown) for providing additional gases, such as inert gases (helium, argon, or the like), gaseous mixtures, or the like, may also be provided. The chamber pressure may be controlled by a throttle valve 136 of the vacuum pump 122.

The duty cycle of the pulsed RF power output at the gate 114 may be controlled by controlling the duty cycle of a pulse generator 138 whose output is coupled to the gate 114. Plasma is generated in an ion generation region 140 corresponding to a volume under the ceiling 106 surrounded by the coil antenna 108. As the plasma is formed in an upper region of the chamber 102 at a distance from the substrate W, the plasma is referred to as a quasi-remote plasma (e.g., the plasma has benefits of remote plasma formation, but is formed within same chamber 102 as the substrate W.)

The plasma is formed in the ion generation region 140 of the chamber 102 via inductive coupling of RF energy from the coil antenna 108 disposed over the ceiling 106, providing a low ion energy (e.g., less than about 5 eV for pulsed plasmas and less than about 25 eV for CW plasmas). In some embodiments, about 25 to 5000 watts of power may be provided to the coil antenna 108 at a suitable frequency to form a plasma (for example, in the MHz or GHz range, or about 13.56 MHz or greater). The power may be provided in a continuous wave or pulsed mode with duty cycles of from about 2 to about 70 percent.

For example, in some embodiments, the plasma may be generated during successive "on" times, and ion energy of the plasma allowed to decay during successive "off" intervals. The "off" intervals separate successive "on" intervals and the "on" and "off" intervals define a controllable duty cycle. The duty cycle limits kinetic ion energy at the surface of the substrate below a pre-determined threshold energy. In some embodiments, the pre-determined threshold energy is at or below about 5 eV.

For example, during the "on" time of the pulsed RF power, the plasma energy increases and during the "off" time it decreases. During the short "on" time, the plasma is generated in the ion generation region 140 loosely corresponding to the volume enclosed by the coil antenna 108. The ion generation region 140 is elevated a significant distance $L_D$ above the substrate W. Plasma generated in the ion generation region 140 near the ceiling 106 during the "on" time drifts at an average velocity $V_D$ toward the substrate W during the "off" time. During each "off" time, the fastest electrons diffuse to the chamber walls, allowing the plasma to cool. The most energetic electrons diffuse to the chamber walls at a much faster velocity than the plasma ion drift velocity $V_D$. Therefore, during the "off" time, the plasma ion energy decreases significantly before the ions reach the substrate W. During the next "on" time, more plasma is produced in the ion generation region 140, and the entire cycle repeats itself. As a result, the energy of the plasma ions reaching the substrate W is significantly reduced. At the lower range of chamber pressure, namely around 10 mT and below, the plasma energy of the pulsed RF case is greatly reduced from that of the continuous RF case.

The "off" time of the pulsed RF power waveform and the distance $L_D$ between the ion generation region 140 and the substrate W must both be sufficient to allow plasma generated in the ion generation region 140 to lose a sufficient amount of its energy so that it causes little or no ion bombardment damage or defects upon reaching the substrate W. Specifically, the "off" time is defined by a pulse frequency from about 2 to about 30 kHz, or at about 10 kHz, and an "on" duty cycle from about 5% to about 20%. Thus, in some embodiments, the "on" interval may last from about 5 microseconds to about 50 microseconds, or about 20 microseconds and the "off" interval may last from about 50 microseconds to about 95 microseconds, or about 80 microseconds. The "off" time is important to allow discharging and neutralization of charge species at wafer features, so ions can travel further and not be deflected.

The plasma generated may be formed in a low pressure process, thereby reducing the likelihood of contamination induced defects. For example, in some embodiments, the chamber 102 may be maintained at a pressure from about 2 mTorr to about 500 mTorr. Moreover, ion collision-induced defects, such as clipping, that would be expected at such a low chamber pressure of less than about 10 mTorr may be limited or prevented by using the quasi-remote plasma source and, optionally, by pulsing the plasma source power as described above.

The substrate may be maintained at about room temperature (about 22 degrees Celsius), or at a temperature from about 20-750 degrees Celsius, or less than about 700 degrees Celsius, or less than about 600 degrees Celsius. In some embodiments, higher temperatures may be utilized as well, such as less than about 800 degrees Celsius in remote plasma oxidation processes.

Figure 2:
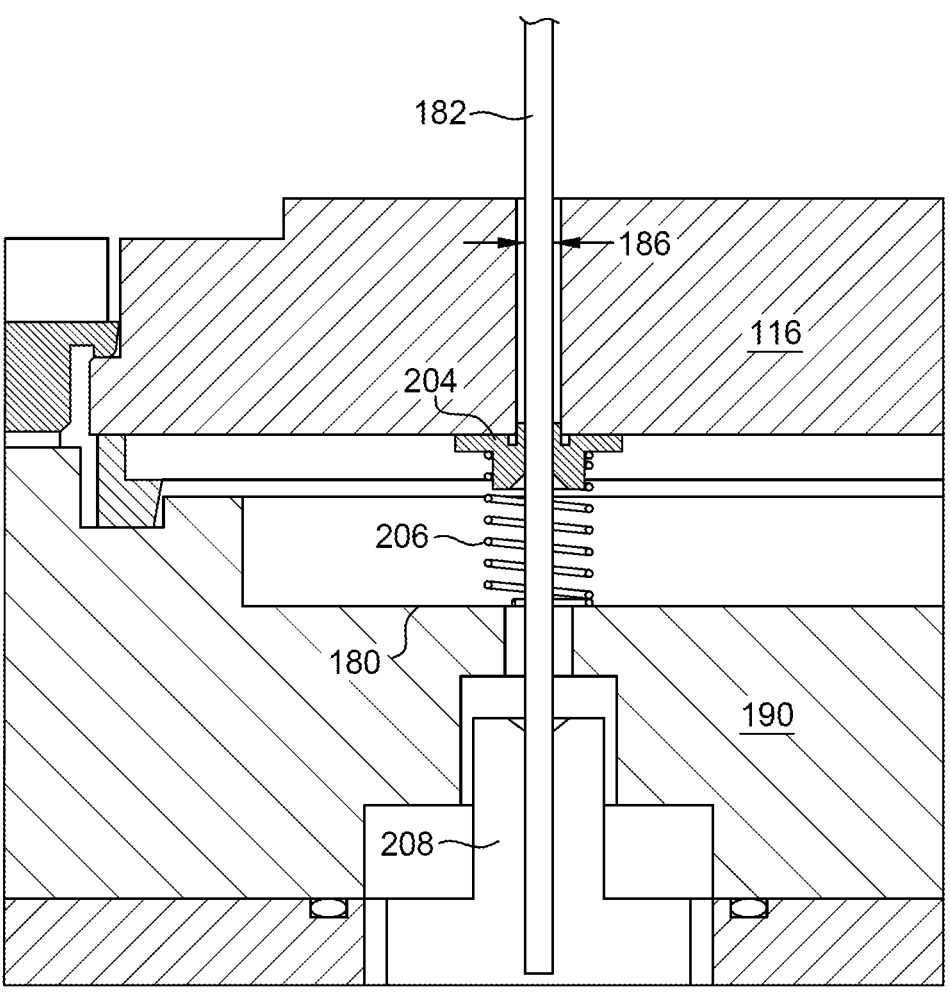
FIG. 2 is a schematic cross-sectional view of a lift pin assembly of the processing chamber of FIG. 1, according to one or more embodiments.

FIG. 2 is a schematic cross-sectional view of a lift pin assembly 180 of the substrate processing system 100 of FIG. 1, according to one or more embodiments. The lift pin assembly 180 includes the lift pin 182, a lift pin guide 204, a spring 206, and a lift pin holder 208. The lift pin 182 may be made of sapphire or quartz. The lift pin 182 may have a diameter 186 from about 0.01 to about 0.2 inches, such as about 0.03 to about 0.1 inches.

The spring 206 is situated between the cooling base 190 and the substrate support pedestal (e.g., ESC) 116 and is coupled to the lift pin guide 204. The spring 206 is configured to support the lift pin guide 204 in a vertical direction. In some embodiments, which can be combined with other embodiments described herein, the spring 206 may be made from a metal alloy, such as a nickel alloy. The lift pin guide 204 is shown in greater detail in FIG. 3. An actuator (not shown) is configured to actuate the lift pin 182 in a vertical direction.

Figure 3:
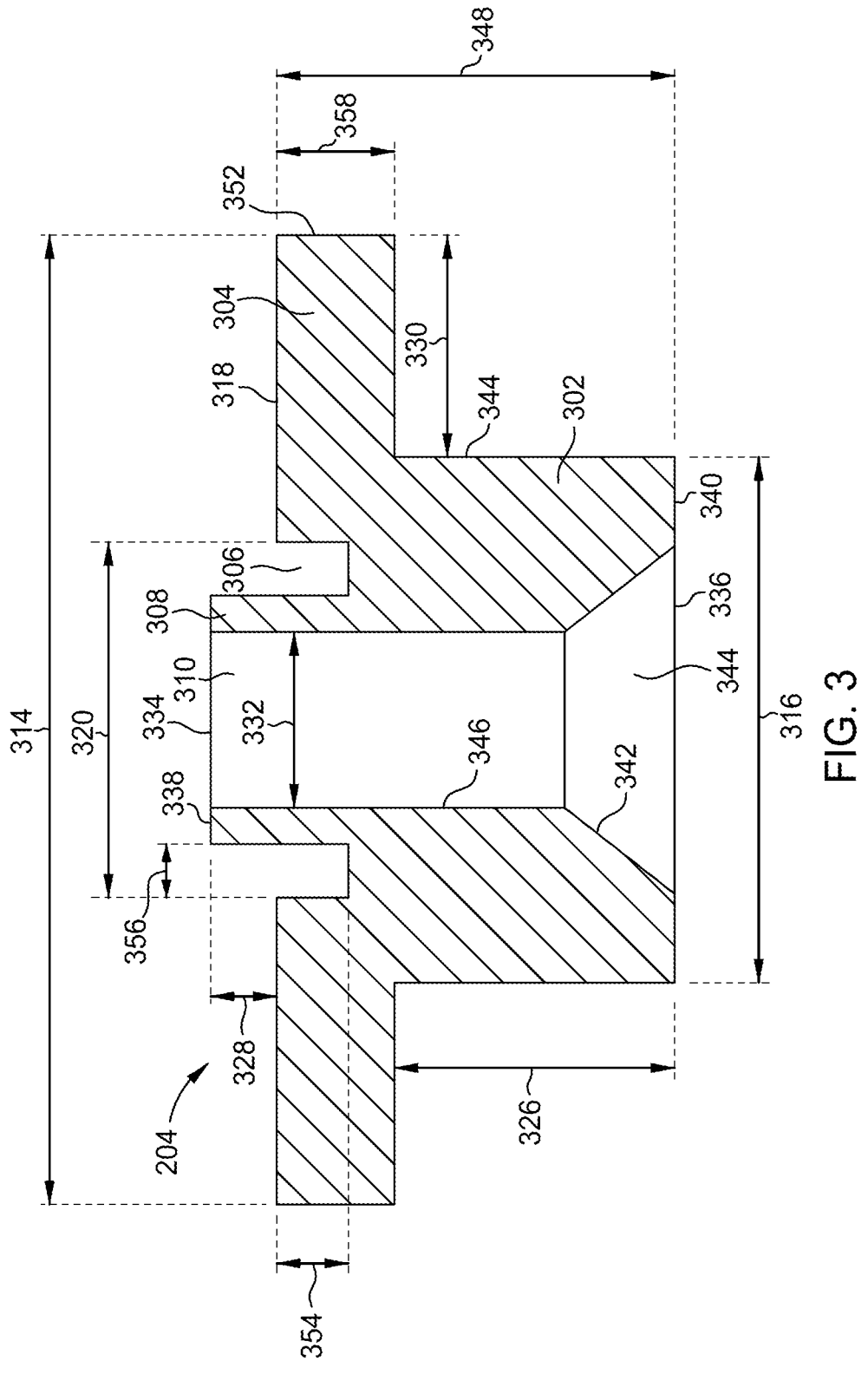
FIG. 3 is a schematic cross-sectional view of a lift pin guide, according to one or more embodiments.

FIG. 3 is a schematic cross-sectional view of the lift pin guide 204, according to one or more embodiments. In various embodiments, the lift pin guide 204 is able to withstand high temperatures (e.g., up to or exceeding 400 degrees Celsius). In some embodiments, which can be combined with other embodiments described herein, the lift pin guide 204 may be composed of a metal or a ceramic (e.g., Aluminum Nitride).

The lift pin guide 204 includes a cylindrical main section 302, a flange 304, a cylindrical recess 306, a cylindrical extension 308, and a bore 310. The cylindrical main section 302 has an outer diameter 316, a length 326, a first surface 340, and an outer surface 344. The outer diameter 316 of the cylindrical main section 302 may be from 0.1 inches and 1.0 inches, such as from 0.2 to 0.8 inches, such as from 0.3 to 0.5 inches. The length 326 of the cylindrical main section 302 may be from about 0.05 to about 0.2 inches, such as from about 0.1 to about 0.15 inches.

The flange 304 has a thickness 358, a length 330, a diameter 314, and a first surface 318. The thickness 358 of the flange 304 may be from 0.01 inches to 0.1 inches. The length 330 of the flange 304 may be from 0.1 inches and 0.9 inches, such as from 0.2 inches to 0.5 inches. The diameter 314 of the flange 304 may be from about 0.3 to about 0.8 inches. The flange 304 is disposed at a first end 312 of the cylindrical main section 302. The diameter 314 of the flange 304 is greater than the outer diameter 316 of the cylindrical main section 302. The length 330 of the flange 304 is measured from the outer diameter 316 of the cylindrical main section 302 to a distal end 352 of the flange 304.

The cylindrical recess 306 has a depth 354, a width 356, and an outer diameter 320. The depth 354 of the cylindrical recess 306 may be from about 0.01 to about 0.05 inches. The width 356 of the cylindrical recess 306 may be from about 0.01 to about 0.1 inches. The outer diameter 320 of the cylindrical recess 306 may be from about 0.1 to about 0.3 inches. The cylindrical recess 306 is formed in the first surface 318 of the flange 304. The first surface 318 of the flange 304 is located opposite the cylindrical main section 302. The outer diameter 320 of the cylindrical recess 306 is less than the outer diameter 316 of the cylindrical main section 302.

The cylindrical extension 308 has a length 328 and a first surface 338. The length 328 of the cylindrical extension 308 may be from about 0.01 to about 0.06 inches. The cylindrical extension 308 may protrude beyond the first surface 318 of the flange 304. The cylindrical extension 308 is concentric with the cylindrical main section 302. A distal end 322 of the cylindrical extension 308 may be substantially planar. The bore 310 is formed through the cylindrical main section 302 and the cylindrical extension 308 and has a diameter 332.

The bore 310 has a length 348, a first end 334, a second end 336, and an inner surface 346. The length 348 of the bore 310 may be from about 0.05 to about 0.4 inches, such as from about 0.1 to about 0.3 inches. The first end 334 of the bore 310 is substantially planar with the first surface 338 of the cylindrical extension 308. The second end 336 of the bore 310 is substantially planar with the first surface 340 of the cylindrical main section 302. In some embodiments, which can be combined with other embodiments disclose herein, the inner surface 346 of the bore 310 is substantially parallel with the outer surface 344 of the cylindrical main section 302.

In some embodiments, which can be combined with other embodiments disclosed herein, the inner surface 346 of the bore 310 has a slope 342. The angle of the slope is from about 0 degrees to about 90 degrees, such as from about 20 to about 80 degrees, such as from about 40 to about 60 degrees, such as from about 40 to about 50 degrees. The slope 342 of the bore 310 may be located at either end of the bore 310. In some embodiments, which can be combined with other embodiments described herein, the slope 342 of the bore 310 increases as it approaches the first end 334 or the second end 336. In some embodiments, which can be combined with other embodiments described herein, the slope 342 does not span the entire length 348 of the bore 310. In some embodiments, which can be combined with other embodiments described herein, the bore 310 may include more than one slope 342. The slope 344 may create a frustum 342. In some embodiments, which can be combined with other embodiments described herein, the frustum 344 is located within the cylindrical main section 302.

In some embodiments, which can be combined with other embodiments described herein, the length 326 of the cylindrical main section 302 is greater than the length 328 of the cylindrical extension 308. In some embodiments, which can be combined with other embodiments described herein, the thickness 358 of the flange 304 is greater than the depth 354 of the cylindrical recess 306. In some embodiments, which can be combined with other embodiments described herein, the lift pin guide 204 is substantially symmetrical along a vertical axis.

The present disclosure achieves at least the following benefits. The lift pin guide described herein allows for a change in the point of contact for the lift pin so that the lift pin is not rubbing against the top of the ESC, but rather the lift pin is in contact with the lift pin guide. As a result, the amount of particles—which can indent and contaminate the backside of a substrate wafer—released during operation of the lift pin is reduced. Furthermore, this configuration allows for the use of softer material lift pins, such as quartz, which, in turn, reduces the likelihood that the lift pin will scratch the back of the substrate wafer. Moreover, the lift pin guide described herein allows for less restricted movement by minimizing the surface area of the lift pin in contact with the lift pin guide.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A lift pin guide, comprising:
a cylindrical main section;
a flange disposed at a first end of the cylindrical main section and having a diameter greater than a diameter of the cylindrical main section;
a cylindrical recess formed in a first surface of the flange, the first surface of the flange opposite the cylindrical main section, the cylindrical recess having an outer diameter less than the diameter of the cylindrical main section;
a cylindrical extension protruding beyond the first surface of the flange, the cylindrical extension concentric with the cylindrical main section; and
a bore formed through the cylindrical main section and the cylindrical extension.

2. The lift pin guide of claim 1, wherein the lift pin guide is composed of aluminum nitride.

3. The lift pin guide of claim 1, wherein the bore includes a frustum at one end thereof, the frustum located within the cylindrical main section, and wherein the frustum has a slope from about 30 to about 60 degrees.

4. The lift pin guide of claim 1, wherein the lift pin guide is substantially symmetrical along a vertical axis.

5. The lift pin guide of claim 1, wherein a thickness of the flange is greater than a depth of the cylindrical recess.

6. A lift pin guide assembly, comprising:
a spring; and
a lift pin guide, comprising:
a cylindrical main section;
a flange disposed at a first end of the cylindrical main section and having a diameter greater than a diameter of the cylindrical main section;
a cylindrical recess formed in a first surface of the flange, the first surface of the flange opposite the cylindrical main section, the cylindrical recess having an outer diameter less than the diameter of the cylindrical main section;
a cylindrical extension protruding beyond the first surface of the flange the cylindrical extension concentric with the cylindrical main section; and
a bore formed through the cylindrical main section and the cylindrical extension.

7. The lift pin guide assembly of claim 6, wherein the cylindrical main section has a length greater than a length of the cylindrical extension.

8. The lift pin guide assembly of claim 6, wherein a first frustum is located within the cylindrical main section at one end of the bore.

9. The lift pin guide assembly of claim 6, further comprising a second frustum located at least partially within the cylindrical extension.

10. The lift pin guide assembly of claim 6, wherein a distal end of the cylindrical extension is substantially planar.

11. The lift pin guide assembly of claim 8, wherein the first frustum has a slope from about 30 to about 60 degrees.

12. The lift pin guide assembly of claim 6, wherein the lift pin guide is substantially symmetrical along a vertical axis.

13. The lift pin guide assembly of claim 6, wherein a thickness of the flange is greater than a depth of the cylindrical recess.

14. The lift pin guide assembly of claim 6, wherein the lift pin guide is composed of a metal or a ceramic.

15. The lift pin guide assembly of claim 6, wherein the lift pin guide is composed of aluminum nitride.

16. The lift pin guide assembly of claim 6, wherein the spring is composed of a metal alloy.

17. A lift pin guide assembly, comprising:
a lift pin;
a spring; and
a lift pin guide, comprising:
a ceramic body, comprising
a cylindrical main section;
a flange disposed at a first end of the cylindrical main section and having a diameter greater than a diameter of the cylindrical main section;
a cylindrical extension protruding beyond a first surface of the flange, the first surface of the flange opposite the cylindrical main section, and the cylindrical extension concentric with the cylindrical main section; and
a bore formed through the cylindrical main section and the cylindrical extension.

18. The lift pin guide assembly of claim 17, wherein the lift pin is made of quartz.

19. The lift pin guide assembly of claim 17, further comprising a cylindrical recess formed in the first surface of the flange.

20. The lift pin guide assembly of claim 17, further comprising a frustum within the bore.

* * * * *